United States Patent
Shih et al.

(10) Patent No.: US 6,900,134 B1
(45) Date of Patent: May 31, 2005

(54) METHOD FOR FORMING OPENINGS IN A SUBSTRATE USING BOTTOM ANTIREFLECTIVE COATINGS

(75) Inventors: Jen-Chieh Shih, Yongkang (TW); Jian-Hong Chen, Hsin-Chu (TW); Bang-Chein Ho, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/803,208

(22) Filed: Mar. 18, 2004

(51) Int. Cl.⁷ .............................................. H01L 21/311
(52) U.S. Cl. .................... 438/702; 438/694; 438/700; 438/703; 438/761; 438/778
(58) Field of Search ................................ 438/689, 700, 438/702, 703, 758, 761, 778

(56) References Cited

U.S. PATENT DOCUMENTS

| | | | |
|---|---|---|---|
| 6,127,259 A | * 10/2000 | Shields et al. | 438/626 |
| 6,258,676 B1 | * 7/2001 | Lee et al. | 438/296 |
| 6,282,248 B1 | * 8/2001 | Farrow et al. | 375/324 |
| 6,458,705 B1 | * 10/2002 | Hung et al. | 438/692 |
| 6,680,252 B2 | * 1/2004 | Chen et al. | 438/691 |
| 6,713,402 B2 | * 3/2004 | Smith et al. | 438/710 |
| 6,815,331 B2 | * 11/2004 | Lee et al. | 438/622 |

* cited by examiner

*Primary Examiner*—Amir Zarabian
*Assistant Examiner*—Thanh Y. Tran
(74) *Attorney, Agent, or Firm*—Duane Morris LLP

(57) ABSTRACT

A method and system is disclosed for selectively forming a pattern for making openings in a substrate. A first set of openings are formed in a first photoresist layer coated on the substrate using a first mask. A developing bottom antireflective coating (BARC) layer is then formed over the first photoresist with the openings filled therewith. A second photoresist layer is formed over the BARC layer. A second set of openings are formed in the second photoresist layer using a second mask exposing the BARC layer directly underneath. The exposed part of the BARC layer is then removed. Subsequently, one or more openings of the first set in the first photoresist layer, after the exposed part of the BARC layer filled therein is removed, are used for forming the openings in the substrate.

21 Claims, 4 Drawing Sheets

METHOD FOR FORMING OPENINGS IN A SUBSTRATE USING BOTTOM ANTIREFLECTIVE COATINGS

BACKGROUND OF INVENTION

This disclosure relates generally to the field of semiconductor manufacturing and more specifically, to the use of a developing bottom antireflective coating placed between two photoresist layers to achieve a packing and unpacking process for forming openings in a device substrate.

A packed-and-unpacked process generally combines a packed contact hole pattern photomask and an unpacked contact hole pattern photomask to produce a quality pattern with well-defined critical dimensions in a photoresist layer and on an etched substrate. The packed pattern is a combination of desired contact openings and also undesired contact openings that are added to densify the first photomask. The packed pattern photomask is utilized to expose and develop the combined pattern of desired and undesired contact openings in a first layer of photoresist. There are two variations that allow the unpacked pattern to achieve the selection of desired contact openings into the final photoresist pattern. The first variation defines islands in the second photoresist layer that are slightly larger than the undesired contact openings in the first photoresist layer and therefore securely cover them. These photoresist islands in the second photoresist layer, in the first variation, are based on the undesired contact openings in the first photoresist layer. The second variation defines larger areas in the second photoresist layer that cover not only the undesired openings in the first photoresist layer, but also the broader areas between the desired contact openings. The remaining openings in the second photoresist layer, over the desired contact openings in the first photoresist layer, are slightly larger than those desired contact openings in the first photoresist layer. The remaining openings in the second photoresist layer, in the second variation, are based on the desired contact openings in the first photoresist layer.

Photoresists are photosensitive films used for the transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced transformation of the photoresist coating thereby transferring the pattern of the photomask to the photoresist-coated substrate. Following the exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less soluble. In general, photoresist compositions comprise at least a resin binder component and a photoactive agent.

In the production of semiconductor devices, an integrated circuit substrate is coated with a film of photo-patterning resist or photoresist, which is exposed to actinic radiation, and developed to define a resist image over the integrated circuit substrate. The resist image includes both lines and spaces, wherein portions of the photo-patterning resist that are removed from the spaces and the portions that remain form the lines. Resolution of the image transferred to the substrate is dependent on the resolution of the resist image.

Typically, these submicrometer closely spaced lines are formed on substrates having non-planar surfaces and other irregular structures. These rough or irregular topographies make it difficult to use a single layer of photoresist without having distorted images. These distorted images can result from the scattered radiation from the underlying structures during the exposure of the photoresist layer. To prevent reflection of actinic radiation into a photo-patterning resist, one or more layers of antireflective coating (ARC) may be provided between a substrate and a photo-patterning resist film.

What is needed is an improved method for using ARC to achieve a packed-and-unpacked process.

SUMMARY

The present invention is directed to a photoresist process for fabricating integrated circuit devices (ICs). A method and system is disclosed for selectively forming a pattern for making openings in a substrate. A first set of openings are formed in a first photoresist layer coated on the substrate using a first mask. A bottom antireflective coating (BARC) layer is then formed over the first photoresist with the openings filled therewith. A second photoresist layer is formed over the BARC layer. A second set of openings are formed in the second photoresist layer using a second mask exposing the BARC layer directly underneath. The exposed part of the BARC layer is then removed. Subsequently, one or more openings of the first set in the first photoresist layer, after the exposed part of the BARC layer filled therein is removed, are used for forming the openings in the substrate.

As illustrated below, in one example, a packed-and-unpacked process (PAU) with an included developing bottom antireflective coating (DBARC) produces well-defined small geometry patterns such as IC contact openings. The BARC helps to control stray, nonvertical reflections of the actinic ultraviolet (UV) light that can expose the photoresist layer in unintended pattern shapes and sizes.

Various aspects of the disclosure will become apparent from the following detailed description, taken in conjunction with the accompanying drawings, illustrating by way of example the principles of the disclosure.

DESCRIPTION

When two layers of photoresist are used in a process for forming a pattern on the substrate, as the developed pattern in the underlying first photoresist layer produces a contoured surface, which overlies a contoured substrate, any layer coated onto that contoured surface is not perfectly flat. Since the developed first photoresist layer and the undeveloped second photoresist layer have different indices of refraction, the difference produces lensing effects that diffract the imposed UV light into nonvertical directions. This also produces some reflection of the UV light. These combined effects cause a UV light scattering effect that can result in exposure of the pattern in the second photoresist layer in unintended shapes and poorly sized patterns. The present disclosure involves using a bottom antireflective coating (BARC) in between a first and second photoresist layers so that the BARC controls reflections of the imposed UV light during the second photoresist patterning process. The insertion of the BARC between the two photoresist layers reduces such unwanted optical effects. The BARC also protects the integrity of the developed pattern in the first photoresist layer from being impacted by unintended UV exposure, which is used for pattern exposure of the second photoresist layer. Further, the pattern-developed first photoresist layer need not be hard baked. The avoidance of the hard bake process is significant because it avoids chemical shrinkage and distortion of critically dimensioned patterns.

As the following description describes processes for making openings in a substrate, masks are frequently used. For the purpose of this disclosure, the terms "mask," "reticle," and "photomask" are all deemed to have the same meaning.

Figure 1A:
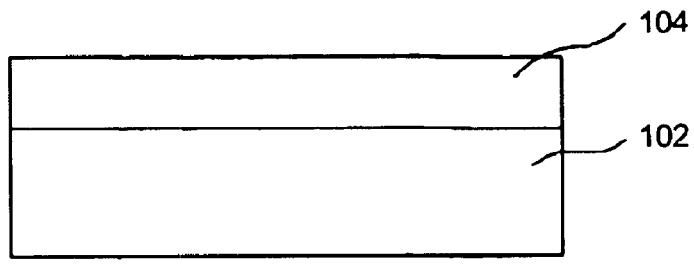
FIGS. 1A to 1I are diagrammatic, partial sectional views of semiconductor structures for illustrating a process in accordance with one example of present disclosure.
Figure 1B:
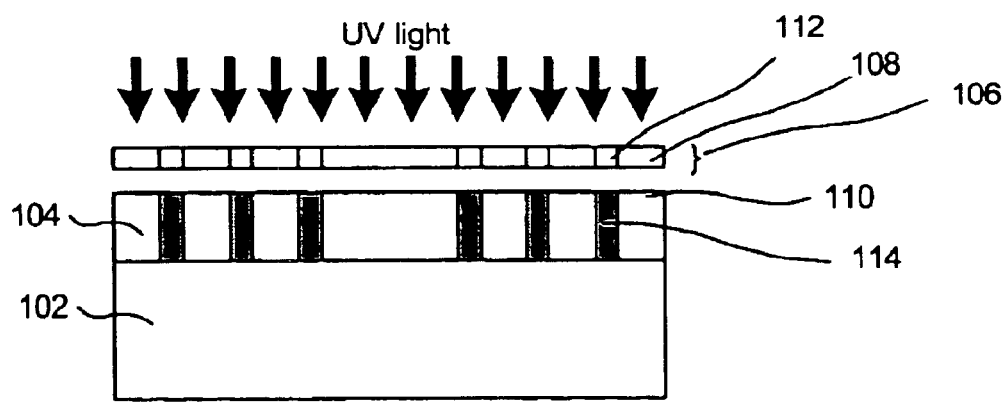

FIG. 1A illustrates a substrate 102 coated by a photoresist layer 104. The substrate is prepared by standard techniques, typically including a hexamethyldisilazane (HMDS) vapor bake. The photoresist is typically soft baked before any light exposure. In FIG. 1B, a light source such as a UV light is imposed via the photomask 106 having a packed pattern on the photoresist layer 104. The packed pattern includes both the openings that are desired in a final pattern image on the photoresist, and also some additional openings, called padding holes/openings, that are not desired in the final pattern. The padding openings are for densifying the mask. As an example, the operation is shown for a positive-acting photoresist. Opaque areas 108 of the photomask 106 leave the photoresist areas 110 that are directly underneath unexposed, and therefore, subsequently insoluble in developer solution. Clear areas 112 of the photomask 106 expose the photoresist areas 114, which will subsequently be soluble in a developer solution.

Figure 1C:
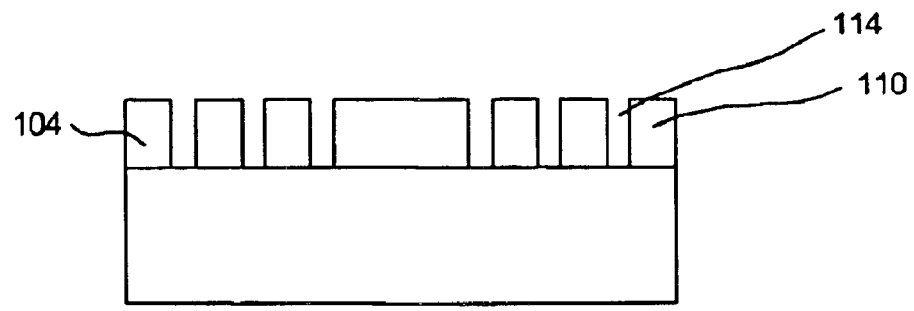

FIG. 1C illustrates the development of the photoresist layer 104 after the exposure to the UV light. Soluble areas 114 are dissolved away so that the packed pattern remains. The photoresist layer may be hard baked at this point.

Figure 1D:
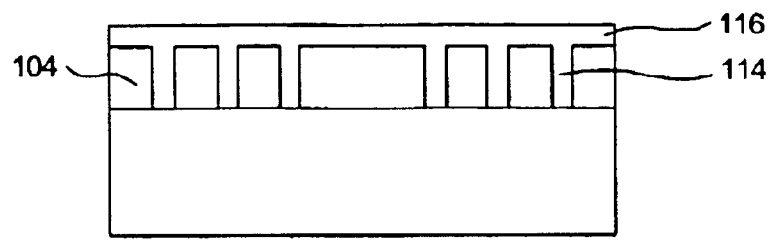

FIG. 1D illustrates the coating of the developed first photoresist layer 104 by a bottom antireflective coating (BARC) 116 such as a developing bottom antireflective coating (DBARC). This coating also fills in the pattern openings 114 of the packed pattern in the developed first photoresist layer 104. This BARC layer 116 both on the developed first photoresist layer 104, and in the openings 114, is then soft baked.

Figure 1E:
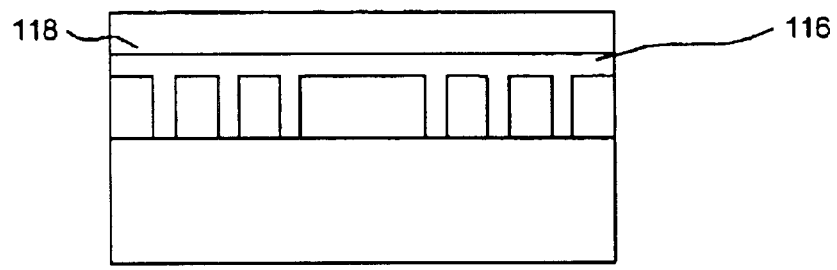
Figure 1F:
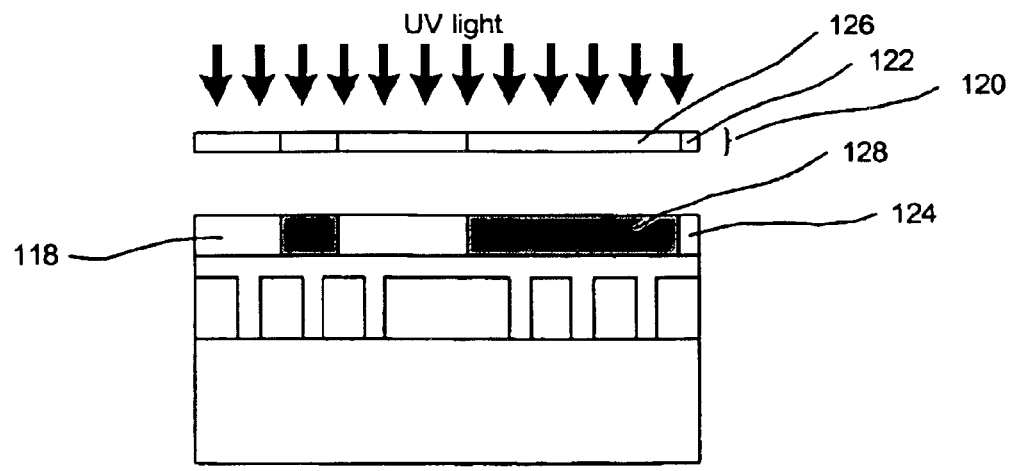

FIG. 1E illustrates the coating of a compatible second photoresist layer 118 onto the BARC 116. The photoresist layer 118 may then be soft baked too. FIG. 1F illustrates the exposure of the second photoresist layer 118 by UV light via a photomask 120 having an unpacked pattern. Opaque areas 122 of the photomask 120 with an unpacked pattern leave the photoresist areas 124 that are directly underneath unexposed. Clear areas 126 of the photomask 120 expose the photoresist areas 128. This maybe followed by a post-exposure bake process. The unexposed areas 124 remain insoluble in a developer solution while the exposed areas 128 become soluble.

Figure 1G:
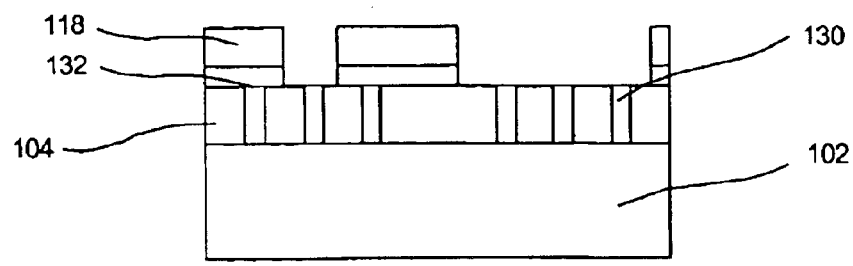
Figure 1H:
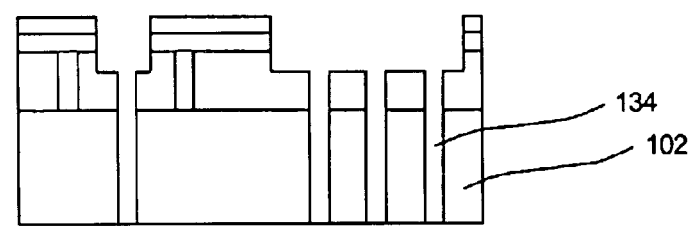
Figure 1I:
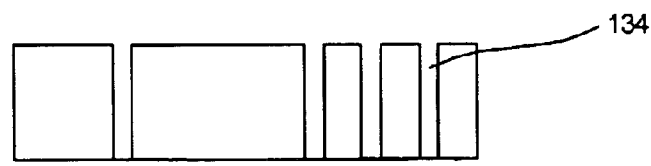

FIG. 1G illustrates the result of the development of the unpacked pattern in the second photoresist layer 118. The process forms patterned openings all the way down to the border of the substrate 102. As see, after the second photoresist layer 118 is developed, it acts as a pattern mask for developing/clearing the BARC 116 during the same develop operation. Since the BARC 116 fills in the pattern openings in the first photoresist layer 104, the removal of the BARC 116 clears the desired openings 130 to the border of the substrate 102. Wherever a second photoresist layer 118 remains, it protects the BARC from being developed. Wherever the second photoresist layer remains over a padding or undesired opening such as the padding 132 in the first photoresist layer, the BARC also remains in that padding or undesired opening. As a net result, a subset of the packed pattern of the first photoresist layer which are openings can be used to define openings in the substrate 102, while the undesired openings in the photoresist are blocked by selective areas of the second photoresist layer and corresponding BARC. A hard bake may be performed. FIG. 1H illustrates the result of the etching of the pattern of desired openings 134 in the substrate 102. FIG. 1I illustrates the only openings 134 in the substrate with the first patterned photoresist layer, the patterned BARC layer, and the second patterned photoresist layer all removed.

Figure 2:
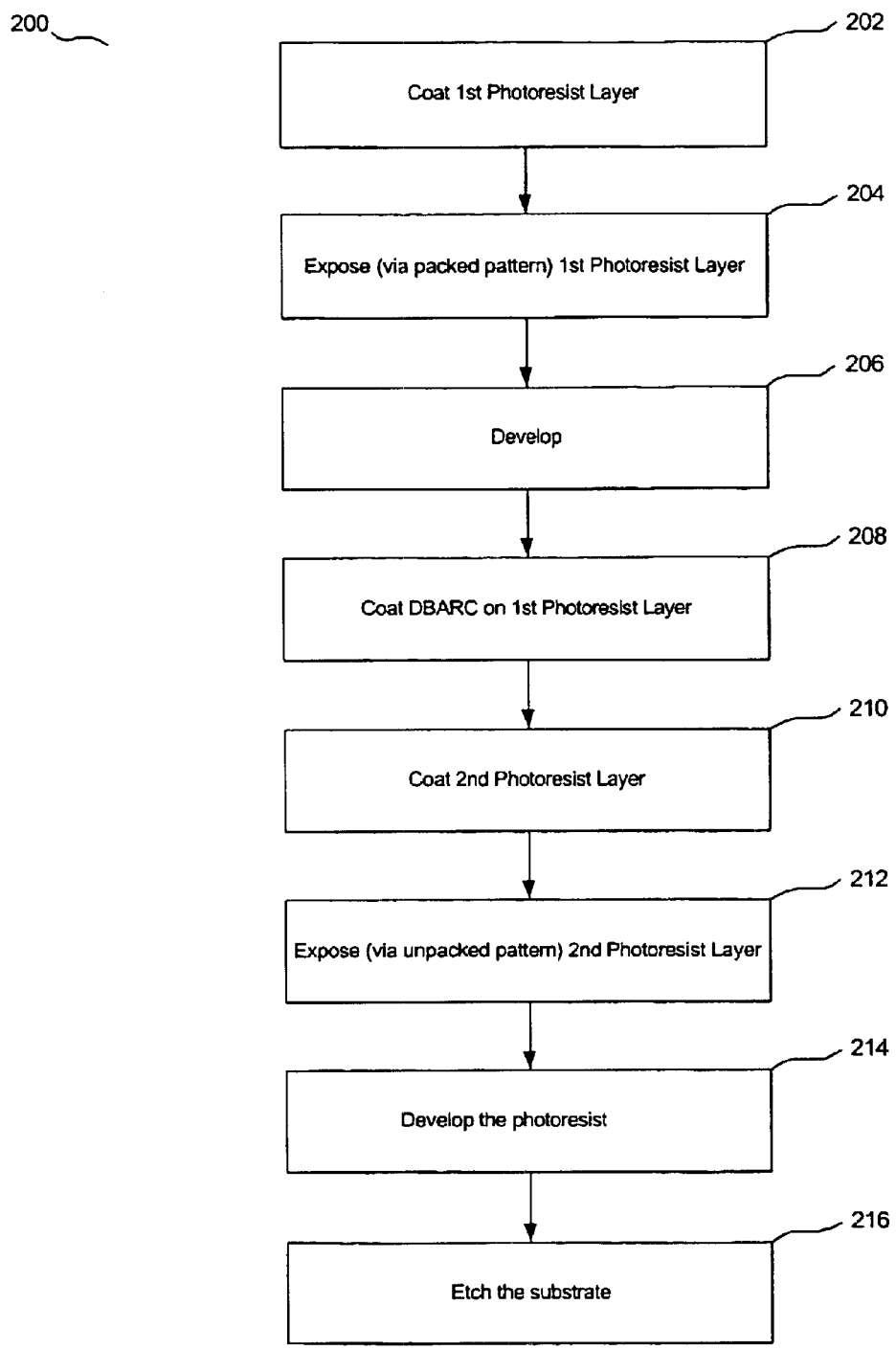
FIG. 2 illustrates a flowchart summarizing the steps of the process illustrated in FIGS. 1A to 1I.

FIG. 2 summarizes a process 200 corresponding to FIG. 1A–FIG. 1I in step 202, the coating of a substrate by a photoresist layer is completed. The substrate may be pretreated by a hexamethyldisilazane (HMDS) vapor bake. The photoresist layer may be soft baked in preparation for pattern exposure.

In step 204, the UV light exposure is carried out via a photomask with a packed pattern on the photoresist layer. The packed pattern on the photoresist contains both the desired openings and the padding or undesired openings. The clear areas of the photomask pattern produce areas of the photoresist that are soluble in a developer solution.

In step 206, the photoresist layer is undergoing a develop process. The areas that have been exposed are dissolved away to produce the packed pattern in the photoresist layer. After this, the substrate directly underneath the openings in the photoresist layer is exposed. At this point, the photoresist layer may be hard baked for material stabilization.

In step 208, a developing bottom antireflective coating (BARC) is coated onto the developed first photoresist layer. The coating also fills in the openings of the packed pattern in the developed first photoresist layer. The BARC may then be soft baked.

In step 210, a second photoresist layer is coated on top of the BARC. The photoresist layer is typically soft baked in preparation for pattern exposure.

In step 212, the UV light is imposed, via a photomask with an unpacked pattern, on to the second photoresist layer.

In step 214, the developing and etching of the photoresist layer is done. The areas that have been exposed are dissolved away by the developer solution to produce the desired openings in the photoresist layer. The BARC is also developed at the same time in the same pattern. The desired openings are now formed all the way down to the borders of the substrate to expose the substrate directly underneath these openings.

The substrate is then etched in step 216 to produce the desired openings based on the pattern in the photoresist layer.

The above disclosure provides many different embodiments, or examples, for implementing different features of the disclosure. Specific examples of components, and processes are described to help clarify the disclosure. These are, of course, merely examples and are not intended to limit the disclosure from that described in the claims.

Although illustrative embodiments of the disclosure have been shown and described, other modifications, changes, and substitutions are intended in the foregoing disclosure. Accordingly, it is appropriate that the appended claims be construed broadly and in a manner consistent with the scope of the disclosure, as set forth in the following claims.

What is claimed is:

1. A method for selectively forming a pattern for making openings in a substrate, the method comprising:
    forming a first set of openings in a first photoresist layer coated on the substrate using a first mask;
    forming a bottom antireflective coating (BARC) layer over the first photoresist with the openings filled therewith;
    forming a second photoresist layer over the BARC layer;
    forming a second set of openings in the second photoresist layer using a second mask exposing the BARC layer directly underneath; and
    removing the exposed part of the BARC layer,
    forming the openings in the substrate through one or more openings of the first set in the first photoresist layer after the exposed part of the BARC layer filled therein is removed.

2. The method of claim 1 wherein the first mask has a packed pattern and the second mask has an unpacked pattern.

3. The method of claim 2 wherein the packed pattern defines the openings in the first photoresist layer and the unpacked pattern defines the openings in the second photoresist layer.

4. The method of claim 3 wherein the openings in the second photoresist layer are wider than the openings in the first photoresist layer underneath.

5. The method of claim 1 further comprising forming openings by etching off the substrate to form one or more openings therein.

6. The method of claim 1 wherein the forming a BARC layer further includes soft baking the BARC layer.

7. The method of claim 1 wherein the BARC layer is a developing bottom antireflective coating layer.

8. A method for forming a photoresist pattern to make openings in a substrate comprising:
    forming a first photoresist layer over a substrate;
    exposing the first photoresist layer to a light source through a first mask;
    forming a first set of openings in the first photoresist layer by removing the exposed portion of the first photoresist layer;
    forming a bottom antireflective coating (BARC) layer over the first photoresist and the first set of openings, the BARC layer having a flat surface;
    forming a second photoresist layer over the BARC layer;
    exposing the second photoresist layer to the light source through a second mask;
    forming a second set of openings in the second photoresist layer exposing the BARC layer directly underneath; and
    removing the exposed BARC layer;
    forming the openings in the substrate through one or more openings of the first set of openings in the first photoresist layer after the exposed BARC layer filled therein is removed.

9. The method of claim 8 wherein the first mask has a packed pattern and the second mask has an unpacked pattern which protects one or more openings of the first set of openings from being used to define the openings in the substrate.

10. The method of claim 8 wherein the openings in the second photoresist layer are wider than the openings in the first photoresist layer underneath.

11. The method of claim 8 wherein the forming a first set of openings further includes hard baking the substrate and the first photoresist.

12. The method of claim 8 wherein the forming a BARC layer further includes soft baking the BARC layer.

13. The method of claim 8 wherein the forming a second photoresist layer further includes soft baking the second photoresist layer.

14. The method of claim 8 further comprising hard baking the first and second photoresist layers and the BARC layer after the exposed BARC layer is removed.

15. The method of claim 8 wherein the BARC layer is a developing bottom antireflective coating layer (DBARC).

16. A method for forming openings in a substrate comprising:
    forming a first photoresist layer over a substrate;
    exposing the first photoresist layer to a light source through a first mask;
    forming a first set of openings in the first photoresist layer by removing the exposed portion of the first photoresist layer;
    forming a bottom antireflective coating (BARC) layer over the first photoresist and the first set of openings, the BARC layer having a flat surface;
    forming a second photoresist layer over the BARC layer;
    exposing the second photoresist layer to the light source through a second mask;
    forming a second set of openings in the second photoresist layer exposing the BARC layer directly underneath; and
    removing the exposed BARC layer; and
    removing the substrate directly underneath one or more openings of the first set of openings in the first photoresist layer after the exposed BARC layer filled therein is removed,
    wherein the second mask is used to protect one or more openings of the first set of openings from being used to define the openings in the substrate.

17. The method of claim 16 wherein the forming a first set of openings further includes hard baking the substrate and the first photoresist.

18. The method of claim 16 wherein the forming a BARC layer further includes soft baking the BARC layer.

19. The method of claim 16 wherein the forming a second photoresist layer further includes soft baking the second photoresist layer.

20. The method of claim 16 further comprising hard baking the first and second photoresist layers and the BARC layer after the exposed BARC layer is removed.

21. The method of claim 16 wherein the BARC layer is a developing bottom antireflective coating layer (DBARC).

* * * * *